(12) United States Patent
Li et al.

(10) Patent No.: US 12,019,827 B2
(45) Date of Patent: Jun. 25, 2024

(54) TOUCH DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Bo Li, Wuhan (CN); Yimei Zhang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/263,097

(22) PCT Filed: Oct. 29, 2020

(86) PCT No.: PCT/CN2020/124767
§ 371 (c)(1),
(2) Date: May 30, 2023

(87) PCT Pub. No.: WO2022/057019
PCT Pub. Date: Mar. 24, 2022

(65) Prior Publication Data
US 2023/0305656 A1    Sep. 28, 2023

(30) Foreign Application Priority Data

Sep. 15, 2020 (CN) .......................... 202010966843.2

(51) Int. Cl.
*G06F 3/041* (2006.01)
*G06F 3/044* (2006.01)
*H10K 59/40* (2023.01)

(52) U.S. Cl.
CPC .......... *G06F 3/0418* (2013.01); *G06F 3/0412* (2013.01); *G06F 3/04164* (2019.05);
(Continued)

(58) Field of Classification Search
CPC .... G06F 3/0443; G06F 3/0418; G06F 3/0446; G06F 3/04164; G06F 3/0412; G06F 3/044; H10K 59/40; G09G 3/3208
See application file for complete search history.

(56) References Cited

U.S. PATENT DOCUMENTS

2016/0306473 A1   10/2016   Lee
2019/0146608 A1*  5/2019   Lee ...................... G06F 3/0416
                                                                  345/174
(Continued)

FOREIGN PATENT DOCUMENTS

CN          102591541 A      7/2012
CN          204087163 U      1/2015
(Continued)

*Primary Examiner* — Muhammad N Edun
(74) *Attorney, Agent, or Firm* — PV IP PC; Wei Te Chung; Zhigang Ma (57) ABSTRACT

A touch display panel is provided, which includes a thin film transistor substrate, a light-emitting layer, an encapsulation layer, and a touch layer. The light-emitting layer includes a cathode. The touch layer includes a plurality of touch sensing electrodes disposed in a same layer. The touch sensing electrodes are connected to a plurality of touch signal lines in a one-to-one correspondence, the touch signal lines are connected to a touch chip, a coupling capacitor is formed between the touch sensing electrodes and the cathode, and the touch chip determines whether there is a touch operation or not by detecting a variation of the coupling capacitor.

18 Claims, 5 Drawing Sheets

(52) U.S. Cl.
CPC .......... *G06F 3/0443* (2019.05); *G06F 3/0446* (2019.05); *H10K 59/40* (2023.02)

(56) References Cited

U.S. PATENT DOCUMENTS

2019/0204954 A1\* 7/2019 Kim ........................ G06F 3/044
2020/0192525 A1\* 6/2020 Li ......................... G06F 3/0446

FOREIGN PATENT DOCUMENTS

| CN | 109992160 A | 7/2019 |
| CN | 111625121 A | 9/2020 |

\* cited by examiner

TOUCH DISPLAY PANEL

RELATED APPLICATIONS

This application is a Notional Phase of PCT Patent Application No. PCT/CN2020/124767 having international filing date of Oct. 29, 2020, which claims the benefit of priority of Chinese Patent Application No. 202010966843.2 filed on Sep. 15, 2020. The contents of the above applications are all incorporated by reference as if fully set forth herein in their entirety.

FIELD OF INVENTION

The present invention relates to the field of touch technologies, and in particular to a touch display panel.

BACKGROUND OF INVENTION

Organic light-emitting diode (OLED) displays have developed rapidly due to their advantages such as lower energy consumption, wide viewing angles, wide color gamut, and thinner thickness compared to liquid crystal displays. At present, touch technologies with OLED display mainly include a plug-in touch scheme and an on-cell touch scheme in which a touch layer is fabricated on a thin film encapsulation layer. Since the on-cell touch scheme does not require a plug-in substrate, an optically clear adhesive layer (OCA) and a touch substrate can be removed, which can effectively reduce a thickness of a module and save material costs, and has significant advantages over the plug-in touch scheme.

At present, OLED on-cell technology is mainly based on mutual capacitance touch technology. However, because the thin film encapsulation layer of a display screen tends to be thinner, the touch layer is positioned increasingly closer to a cathode of the display screen. Therefore, a coupling parasitic capacitance is formed between the cathode of the display screen and touch electrodes, which is unfavorable for touch driving and is a major challenge for a touch driving chip.

SUMMARY OF INVENTION

Technical Problem

Embodiments of the present invention provide a touch display panel to solve a problem in a conventional art that, due to an thin film encapsulation layer of a display panel tends to be thinner, resulting in a touch layer of an on-cell module positioned increasingly closer to a cathode of the display panel, a coupling parasitic capacitance formed between the cathode and touch electrodes adversely affects a touch driving, thereby affecting a technical problem of touch accuracy.

Solution to Technical Problem

Technical Solutions

To solve the above problems, the technical solution provided by the present invention is as follows.

An embodiment of the present invention provides a touch display panel including a thin film transistor substrate, a light-emitting layer disposed on the thin film transistor substrate, the light-emitting layer including a cathode; an encapsulation layer disposed on the light-emitting layer; and a touch layer disposed on the encapsulation layer and the touch layer including a plurality of touch sensing electrodes disposed in a same layer; wherein the touch sensing electrodes are connected to a plurality of touch signal lines in a one-to-one correspondence, the touch signal lines are connected to a touch chip, a coupling capacitor is formed between the touch sensing electrodes and the cathode, the touch chip determines whether there is a touch operation or not by detecting a variation of the coupling capacitor; the touch sensing electrodes are made of a metal grid structure, each of intersections of metal lines of the metal grid is a closed arc-shape; and a plurality of protrusions are disposed on two opposite sides of each of the touch sensing electrodes, and the protrusions disposed on each of the sides are engaged with the protrusions of adjacent one of the touch sensing electrodes.

In an embodiment of the present invention, the touch layer includes a first sub-region, a second sub-region, and a third sub-region, the first sub-region and the second sub-region region are disposed oppositely, and the third sub-region is disposed adjacent to the first sub-region and the second sub-region.

In an embodiment of the present invention, the first sub-region includes a first outer side, the second sub-region includes a second outer side disposed opposite to the first outer side, and the third sub-region includes a third outer side disposed perpendicular to the first outer side and the second outer side.

In an embodiment of the present invention, the touch chip is disposed in a frame region of the touch display panel and close to the third outer side.

In an embodiment of the present invention, each of the touch signal lines connected to the touch sensing electrodes positioned in the first sub-region is led out from the first outer side and is connected to the touch chip, each of the touch signal lines connected to the touch sensing electrodes positioned in the second sub-region is led out from the second outer side and is connected to the touch chip, and each of the touch signal lines connected to the touch sensing electrodes positioned in the third sub-region is led out from the third outer side and is connected to the touch chip.

In an embodiment of the present invention, the touch signal lines and the touch sensing electrodes are disposed in a same layer.

In an embodiment of the present invention, the touch signal lines are disposed in a part of a gap formed by the adjacent touch sensing electrodes positioned in the display region.

In an embodiment of the present invention, the touch signal lines and the touch sensing electrodes are disposed in different layers, and each of the touch signal lines is connected to a corresponding one of the touch sensing electrodes through a via.

An embodiment of the present invention further provides another touch display panel, including a thin film transistor substrate; a light-emitting layer disposed on the thin film transistor substrate, the light-emitting layer including a cathode; an encapsulation layer disposed on the light-emitting layer; and a touch layer disposed on the encapsulation layer and the touch layer including a plurality of touch sensing electrodes disposed in a same layer; wherein the touch sensing electrodes are connected to a plurality of touch signal lines in a one-to-one correspondence, the touch signal lines are connected to a touch chip, a coupling capacitor is formed between the touch sensing electrodes and the cathode, the touch chip determines whether there is a touch operation or not by detecting a variation of the coupling capacitor.

In an embodiment of the present invention, the touch layer includes a first sub-region, a second sub-region, and a third sub-region, the first sub-region and the second sub-region region are disposed oppositely, and the third sub-region is disposed adjacent to the first sub-region and the second sub-region.

In an embodiment of the present invention, the first sub-region includes a first outer side, the second sub-region includes a second outer side disposed opposite to the first outer side, and the third sub-region includes a third outer side disposed perpendicular to the first outer side and the second outer side.

In an embodiment of the present invention, the touch chip is disposed in a frame region of the touch display panel and close to the third outer side.

In an embodiment of the present invention, each of the touch signal lines connected to the touch sensing electrodes positioned in the first sub-region is led out from the first outer side and is connected to the touch chip, each of the touch signal lines connected to the touch sensing electrodes positioned in the second sub-region is led out from the second outer side and is connected to the touch chip, and each of the touch signal lines connected to the touch sensing electrodes positioned in the third sub-region is led out from the third outer side and is connected to the touch chip.

In an embodiment of the present invention, the touch signal lines and the touch sensing electrodes are disposed in a same layer.

In an embodiment of the present invention, the touch signal lines are disposed in a part of a gap formed by the adjacent touch sensing electrodes positioned in the display region.

In an embodiment of the present invention, the touch signal lines and the touch sensing electrodes are disposed in different layers, and each of the touch signal lines is connected to a corresponding one of the touch sensing electrodes through a via.

In an embodiment of the present invention, the touch sensing electrodes are made of a metal grid structure, each of intersections of metal lines of the metal grid is a closed arc-shape.

In an embodiment of the present invention, a plurality of protrusions are disposed on two opposite sides of each of the touch sensing electrodes, and the protrusions disposed on each of the sides are engaged with the protrusions of adjacent one of the touch sensing electrodes.

In an embodiment of the present invention, shapes of the protrusions are isosceles trapezoidal, isosceles triangle, or bar-shaped.

In an embodiment of the present invention, shapes of the touch sensing electrodes are circular, elliptical, rectangular, diamond, or square.

Advantages of Invention

Beneficial Effect

By arranging a single-layer touch sensing electrode that forms a coupling capacitor with the cathode, the touch chip detects whether there is a touch operation or not by detecting the variation of the coupling capacitor, which can effectively prevent the cathode from absorbing a mutual capacitance sensing signal in a mutual capacitance touch scheme, and improves sensitivity and stability of a touch. The touch sensing electrodes are divided into a plurality of regions, and the touch signal lines in different regions are led out from different directions, which can minimize a space occupied by the touch signal lines, and then increase an effective region of touch sensing electrodes.

EMBODIMENTS OF INVENTION

Detailed Description of Embodiments

The present application provides a touch display panel. In order to make the objectives, technical solutions, and effects of the present application in a clearer manner, the present application will be further described in detail below with reference to the drawings and embodiments. It should be understood that the specific embodiments described here are only used to explain the application, and not used to limit the application.

Figure 1:
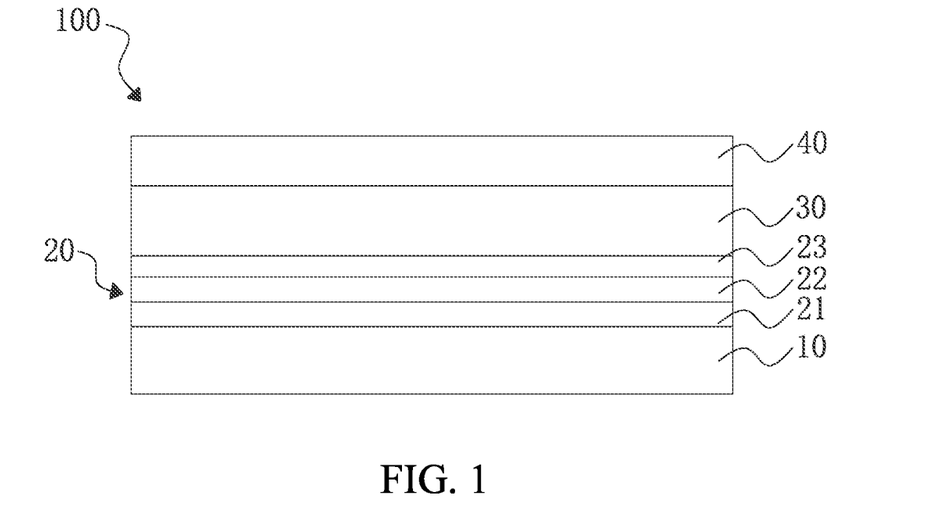
FIG. 1 is a schematic structural diagram of a touch display panel provided by an embodiment of the present invention.
Figure 2:
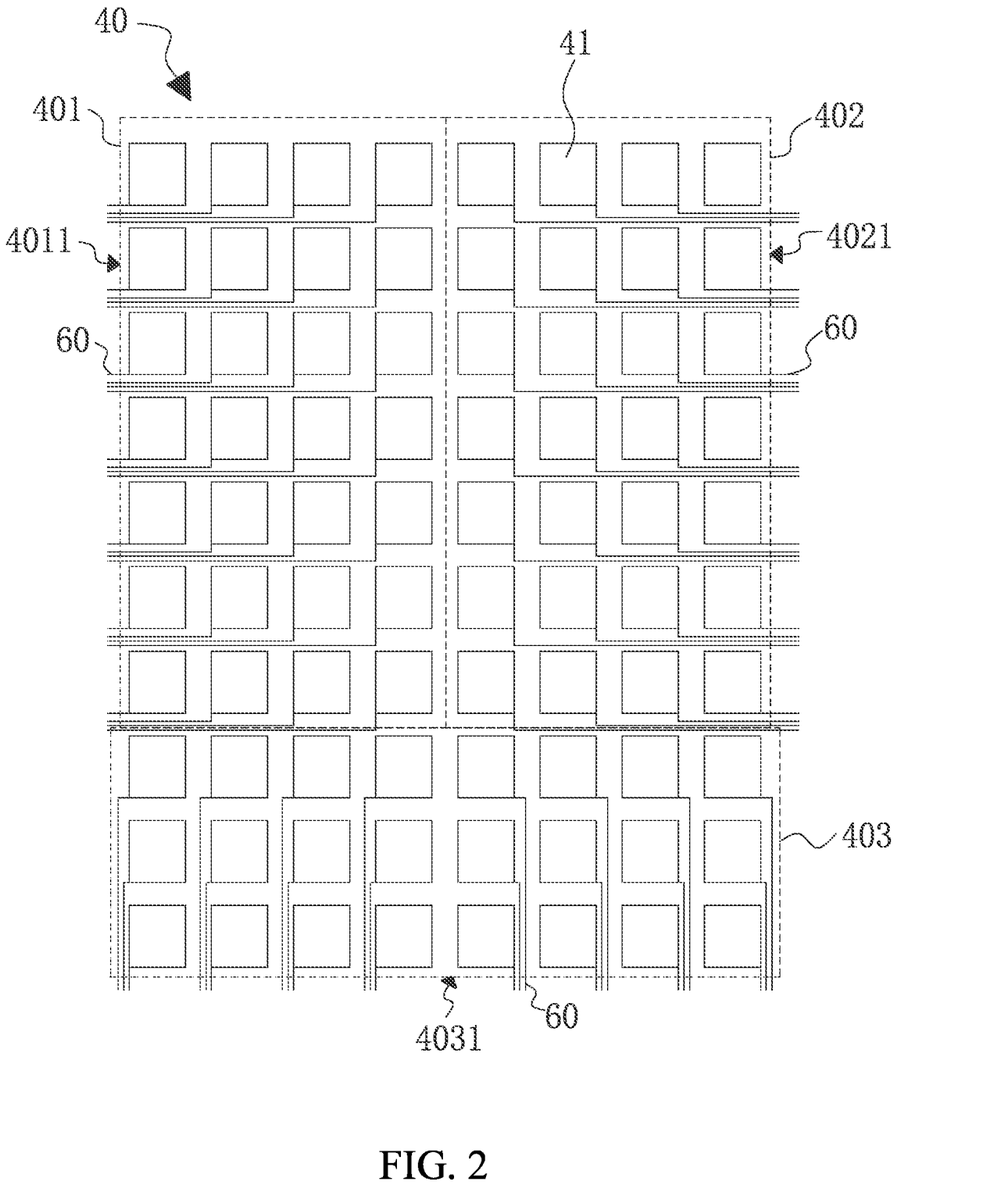
FIG. 2 is a schematic structural diagram of a touch layer provided by an embodiment of the present invention.

Referring to FIG. 1 and FIG. 2, the present invention provides a touch display panel 100 including a thin film transistor substrate 10, a light-emitting layer 20, an encapsulation layer 30, and a touch layer 40. The light-emitting layer 20 is disposed on the thin film transistor substrate 10, the encapsulation layer 30 is disposed on the light-emitting layer 20, and the touch layer 40 is disposed on the encapsulation layer.

Wherein, the light-emitting layer 20 includes a cathode 23, and the touch layer 40 includes a plurality of touch sensing electrodes 41 disposed in a same layer. In the embodiment of the present invention, the touch layer 40 has an on-cell structure, the touch layer 40 can be directly fabricated on the encapsulation layer 30, a substrate configured to carry the touch layer 40 and an optically clear adhesive layer bonded to the thin film transistor substrate 10 can be removed, therefore the touch display panel 100 can be effectively reduced.

The thin film transistor substrate 10 includes a substrate and a plurality of thin film transistors. The substrate can be a rigid substrate or a flexible substrate.

The light-emitting layer 20 further includes an anode 21 disposed on the thin film transistor substrate 10 and a functional layer 22 disposed on the anode 21, and the cathode 23 is disposed on the functional layer 22.

In an embodiment of the present invention, the functional layer 22 can include a hole injection layer, a hole transport layer, a luminescent material layer, an electron transport layer, and an electron injection layer, which are disposed in sequence.

In an embodiment of the present invention, the encapsulation layer 30 can be disposed in a manner of a first inorganic layer, an organic layer, and a second inorganic laminated layer to prevent the light-emitting layer 20 from an erosion of water and oxygen.

Figure 3:
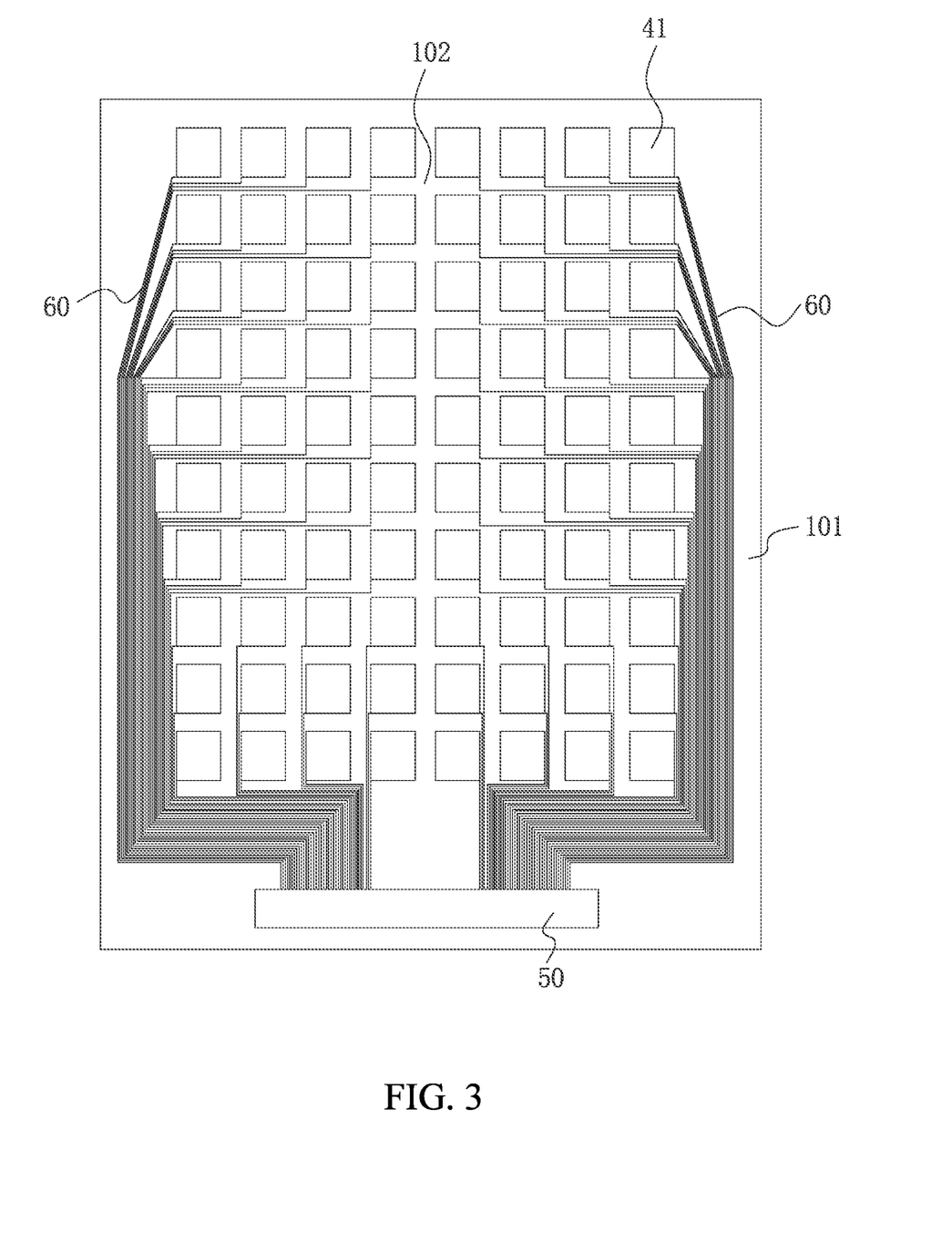
FIG. 3 is another schematic structural diagram of the touch layer provided by an embodiment of the present invention.

Since the encapsulation layer 30 tends to be thinner, as a thickness of the encapsulation layer 30 becomes thinner and thinner, the touch layer 40 is positioned increasingly closer to the cathode 23, a coupling parasitic capacitance formed between the touch sensing electrodes 41 and the cathode 23 is very unfavorable to a mutual-capacitive touch driving, and affects an accuracy of a touch driving. Refer to FIG. 3, in the embodiment of the present invention, a single layer of the touch sensing electrodes 41 is disposed on the encapsulation layer 30, and there is no need to provide touch driving electrodes. A coupling capacitor is formed between the touch sensing electrodes 41 and the cathode, a touch chip 50 determines whether there is a touch operation or not by detecting a variation of the coupling capacitor, and realizes a self-capacitive touch driving.

The touch display panel 100 can be applied to a touch display screen. Specifically, when the user's finger performs a touch operation on the screen, since the finger can be considered as a well-grounded conductor, a coupling capacitance formed between the touch sensing electrodes 41 and the cathode 23 is changed (generally a capacitance value will increase), and the touch chip 50 transmits a pulse driving signal to the touch sensing electrodes 41. Since a capacitor has a characteristic of storing charges, after the pulse signal emitted by a pulse has charged the capacitor, the capacitor will reversely release an electrical signal to the touch chip 50. The touch chip 50 detects the variation of the coupling capacitor through its digital-to-analog converter, and then determines whether there is the touch operation or not.

Since the touch chip 50 detects the driving signal returned by the touch sensing electrodes 41, the touch chip 50 connects with the touch sensing electrodes 41 through a plurality of touch signal lines 60, therefore it is not necessary for the touch chip 50 to be electrically connected to the cathode 23.

Refer to FIG. 3, in an embodiment of the present invention, the touch sensing electrodes 41 and the touch signal lines 60 are connected in a one-to-one correspondence, and the touch signal lines 60 are connected to the touch chip 50, that is, each of the touch sensing electrodes 41 is independently connected to the touch chip 50 through one of the touch signal lines 60.

The touch electrodes in a conventional art are generally connected by a row of bridge lines, and the touch electrodes in a same row or in a same column are led out through a same signal line. Although this can effectively reduce a number of leads, however, a parasitic capacitance formed between the touch electrodes and the cathode that are turned on in rows or columns will increase a lot, resulting in more serious touch signal delay, especially for large-sized products, and there will be a problem of driving difficulties. Therefore, in the embodiment of the present invention, each of the touch sensing electrodes 41 is led out through an independent touch signal line 60, which can effectively reduce an occurrence of signal delay and improve a driving capability and a touch sensitivity of the touch chip 50.

Refer to FIG. 2, in an embodiment of the present invention, the touch layer 40 includes a first sub-region 401, a second sub-region 402, and a third sub-region 403. The first sub-region 401 and the second sub-region region 402 are disposed oppositely, and the third sub-region 403 is disposed adjacent to the first sub-region 401 and the second sub-region 402. The touch signal lines 60 positioned in the first sub-region 401, the second sub-region 402, and the third sub-region 403 are led out from different directions.

Since each of the touch sensing electrodes 41 is led out through a single one of the touch signal lines 60, the touch signal lines 60 will occupy a certain space. If the touch signal lines 60 are all led out from a lower end of the touch display panel 100, an area of the touch sensing electrodes 41 positioned close to a leading out end will gradually decrease, resulting in a decrease in touch accuracy. Therefore, in the embodiment of the present invention, the touch signal lines 60 are led out from different directions in different regions, which can greatly reduce an area loss of the touch signal lines 60 positioned close to the leading out end, thereby effectively improving touch sensitivity.

In an embodiment of the present invention, the first sub-region 401 includes a first outer side 4011, the second sub-region 402 includes a second outer side 4021, and the third sub-region 403 includes a third outer side 4031. The first outer side 4011 and the second outer side 4021 are disposed oppositely, and the third outer side 4031 is disposed perpendicular to the first outer side 4011 and the second outer side 4021.

It can be understood that the first outer side 4011, the second outer side 4021, and the third outer side 4031 are all positioned outside of their respective corresponding regions.

Specifically, the first sub-region 401, the second sub-region 402, and the third sub-region 403 can form a shape of two squares at bottom and one square positioned above and between the two squares.

In an embodiment of the present invention, the first sub-region 401, the second sub-region 402, and the third sub-region 403 can all be rectangular. The first outer side 4011 is a long side of the first sub-region 401, the second outer side 4021 is a long side of the second sub-region 403, and the third outer side 4031 is a long side of the third sub-region 403. A sum of a width of the first sub-region 401 and a width of the second sub-region 402 is equal to a length of the third sub-region 403.

Refer to FIG. 3, the touch display panel includes a display region 102 and a frame region 101 disposed around the display region 102. The display region 102 is configured to realize display and touch control, and the frame region 101 is configured to accommodate traces.

Specifically, the first outer side 4011 can be positioned close to a left frame of the frame region 101, the second outer side 4021 can be positioned close to a right frame of the frame region 101, and the third outer side 4031 can be positioned close to a lower frame of the frame region 101. The touch chip 50 is disposed in the frame region 101 and is disposed close to the third outer side 4031.

The touch signal lines 60 positioned in the first sub-region 401 and the touch signal lines 60 positioned in the second sub-region 402 are respectively led out from a left side and a right side (left and right frames) of the touch display panel 100, and then are connected to the touch chip 50. The touch signal lines 60 positioned in the third sub-region 403 are led out from a lower side (lower frame) of the touch display panel 100, and then are connected to the touch chip 50. Therefore, the touch signal lines 60 are led out from the left and right sides and the lower side of the touch display panel 100 to reduce a space occupied by the touch signal lines 60.

Specifically, each of the touch signal lines 60 connected to the touch sensing electrodes 41 positioned in the first sub-region 401 is led out from the first outer side 4011 and is connected to the touch chip 50. Each of the touch signal lines 60 connected to the touch sensing electrodes 41 positioned in the second sub-region 402 is led out from the second outer side 4021 and is connected to the touch chip 50. Each of the touch signal lines 60 connected to the touch sensing electrodes 41 positioned in the third sub-region 403 is led out from the third outer side 4031 and is connected to the touch chip 50.

In an embodiment of the present invention, the touch chip 50 can be disposed at the lower frame of the frame region 101. The touch chip 50 may have a chip on film (COF) structure to reduce a width of the lower frame.

In an embodiment of the present invention, the touch signal lines 60 and the touch sensing electrodes 41 can be disposed in a same layer. Material of the touch signal lines 60 and material of the touch sensing electrodes 41 can be one of metal or indium tin oxide (ITO) materials.

When the material of the touch signal lines 60 is same as the material of the touch sensing electrodes 41, the touch signal lines 60 and the touch sensing electrodes 41 can be fabricated through a same photomask process.

The touch signal lines 60 are disposed in a part of a gap formed by the adjacent touch sensing electrodes 41 positioned in the display region 102.

In other embodiments, the touch signal lines 60 and the touch sensing electrodes 41 can be disposed in different layers, and each of the touch signal lines 60 can be connected to a corresponding one of the touch sensing electrodes 41 through a via.

The touch sensing electrodes 41 can be disposed in a matrix. Shapes of the touch sensing electrodes 41 can be circular, elliptical, rectangular, diamond, square, or other polygonal shapes, and there is no limitation here.

Figure 5:
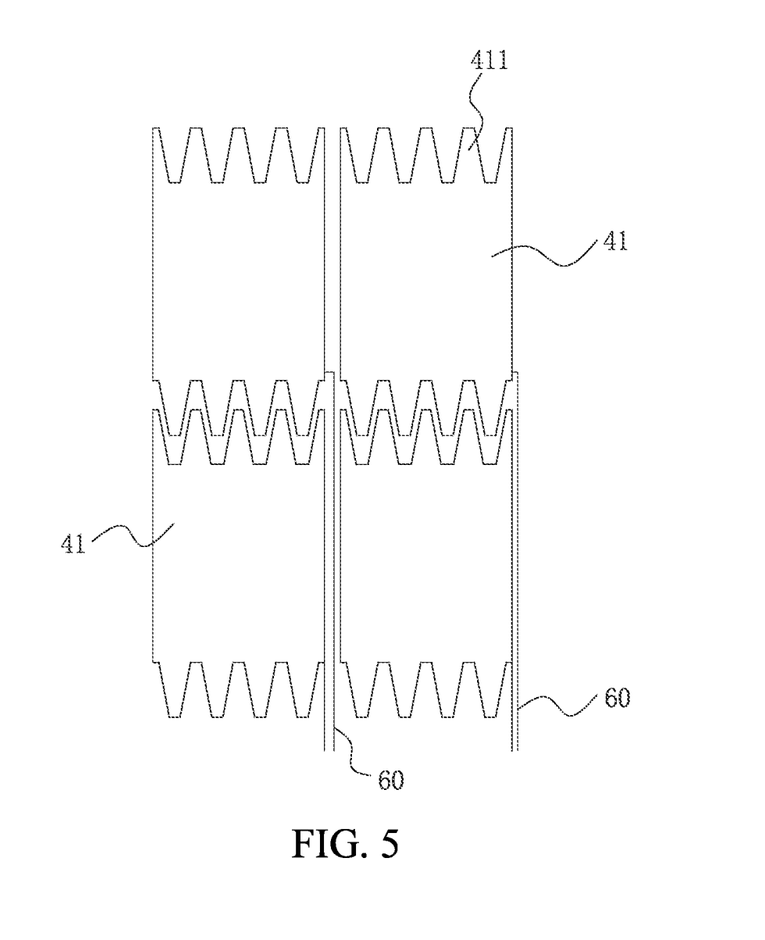
FIG. 5 is a schematic structural diagram of touch sensing electrodes provided by an embodiment of the present invention.

Refer to FIG. 5, in an embodiment of the present invention, a main body of each of the touch sensing electrodes 41 can be rectangular, a plurality of protrusions 411 are disposed on two opposite sides of each of the touch sensing electrodes 41, and the protrusions 411 disposed on each of the sides are engaged with the protrusions 411 of adjacent one of the touch sensing electrodes 41. This design can increase an interaction region of adjacent two of the touch sensing electrodes 41 and enhance a capacitance signal value of the adjacent two of the touch sensing electrodes 41, which is beneficial to realize a precise positioning of a finger touch operation.

Shapes of the protrusions 411 are isosceles trapezoidal. In other embodiments, the shapes of the protrusions 411 can also be isosceles triangular or bar-shaped.

Figure 6:
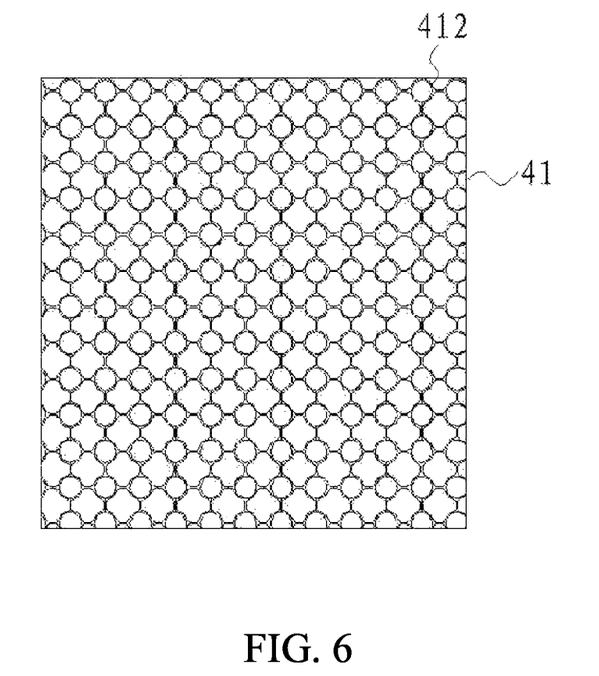
FIG. 6 is another schematic structural diagram of the touch sensing electrodes provided by an embodiment of the present invention.

Refer to FIG. 6, in an embodiment of the present invention, the touch sensing electrodes 41 can be made of a metal grid structure, each of intersections of metal lines of the metal grid is a closed arc-shape. The closed arc-shape can be a solid structure or a hollow structure. A size of the closed arc-shape can be different. Compared with a common square metal grid, the structure of this design is more flexible when the touch display panel 100 is used for bending, and has a stress buffer effect.

A size of the touch sensing electrodes 41 is less than 7 millimeters. If the size is too large, it will not meet touch accuracy requirements of mobile phone products. When the touch sensing electrodes 41 is circular, the size refers to a diameter of the circular shape; when the touch sensing electrodes 41 is rectangular, the size refers to a length and a width of the rectangular shape.

Figure 4:
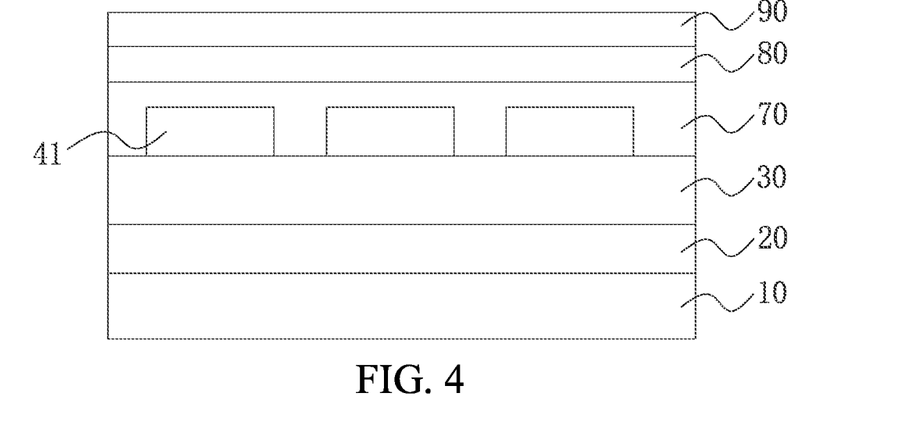
FIG. 4 is a schematic structural diagram of a touch display panel provided by another embodiment of the present invention.

Refer to FIG. 4, in other embodiments of the present invention, the touch display panel 100 further includes a protective layer 70 disposed on the touch layer 40, and the protective layer 70 can effectively protect a touch circuit and prevent the touch circuit from damages of water vapor or other external factors.

The protective layer 70 can further be disposed with a polarizing layer 80, and the polarizing layer 80 can be formed by a photomask, or can be formed by attaching a polarizer.

A cover plate 90 is attached to the polarizing layer 80, and the cover plate 90 can be selected from glass, polyimide, and other transparent materials according to actual design requirements.

For the specific implementation of each of the above operations, refer to the previous embodiments, which will not be repeated here.

In summary, the touch display panel 100 provided by the present invention can effectively solve the problem of weakened mutual capacitance signal absorption caused by the cathode in a conventional mutual capacitance design scheme, and has obvious advantages in a design of medium and large size products. In addition, patterns of touch sensing electrodes 41 provided by the present invention can also enhance capacitance signals between adjacent touch sensing electrodes, improving a high-precision positioning of touch operations, and effectively enhancing the sensitivity of touch operations.

It can be understood that, for those of ordinary skill in the art, equivalent replacements or changes can be made according to the technical solution of the present application and its inventive concept, and all these changes or replacements shall fall within the protection scope of the appended claims of the present application.

What is claimed is:

1. A touch display panel, comprising:
a thin film transistor substrate;
a light-emitting layer disposed on the thin film transistor substrate, the light-emitting layer comprising a cathode;
an encapsulation layer disposed on the light-emitting layer; and
a touch layer disposed on the encapsulation layer, and the touch layer comprising a plurality of touch sensing electrodes disposed in a same layer;
wherein the touch sensing electrodes are connected to a plurality of touch signal lines in a one-to-one correspondence, the touch signal lines are connected to a touch chip, a coupling capacitor is formed between the touch sensing electrodes and the cathode, and the touch chip determines whether there is a touch operation or not by detecting a variation of the coupling capacitor;
the touch sensing electrodes are made of a metal grid structure, each of intersections of metal lines of the metal grid is a closed arc-shape; and
a plurality of protrusions are disposed on two opposite sides of each of the touch sensing electrodes, and the protrusions disposed on each of the sides are engaged with the protrusions of adjacent one of the touch sensing electrodes, and
wherein the touch layer comprises a first sub-region, a second sub-region, and a third sub-region, the first sub-region and the second sub-region region are disposed oppositely, and the third sub-region is disposed adjacent to the first sub-region and the second sub-region.

2. The touch display panel according to claim 1, wherein the first sub-region comprises a first outer side, the second sub-region comprises a second outer side disposed opposite to the first outer side, and the third sub-region comprises a third outer side disposed perpendicular to the first outer side and the second outer side.

3. The touch display panel according to claim 2, wherein the touch chip is disposed in a frame region of the touch display panel and close to the third outer side.

4. The touch display panel according to claim 2, wherein each of the touch signal lines connected to the touch sensing electrodes positioned in the first sub-region is led out from the first outer side and is connected to the touch chip, each of the touch signal lines connected to the touch sensing electrodes positioned in the second sub-region is led out from the second outer side and is connected to the touch chip, and each of the touch signal lines connected to the touch sensing electrodes positioned in the third sub-region is led out from the third outer side and is connected to the touch chip.

5. The touch display panel according to claim 1, wherein the touch signal lines and the touch sensing electrodes are disposed in a same layer.

6. The touch display panel according to claim 5, wherein the touch signal lines are disposed in a part of a gap formed by the adjacent touch sensing electrodes positioned in a display region.

7. The touch display panel according to claim 1, wherein the touch signal lines and the touch sensing electrodes are disposed in different layers, and each of the touch signal lines is connected to a corresponding one of the touch sensing electrodes through a via.

8. A touch display panel, comprising:
a thin film transistor substrate;
a light-emitting layer disposed on the thin film transistor substrate, the light-emitting layer comprising a cathode;
an encapsulation layer disposed on the light-emitting layer; and
a touch layer disposed on the encapsulation layer, and the touch layer comprising a plurality of touch sensing electrodes disposed in a same layer;
wherein the touch sensing electrodes are connected to a plurality of touch signal lines in a one-to-one correspondence, the touch signal lines are connected to a touch chip, a coupling capacitor is formed between the touch sensing electrodes and the cathode, and the touch chip determines whether there is a touch operation or not by detecting a variation of the coupling capacitor, and
wherein the touch layer comprises a first sub-region, a second sub-region, and a third sub-region, the first sub-region and the second sub-region region are disposed oppositely, and the third sub-region is disposed adjacent to the first sub-region and the second sub-region.

9. The touch display panel according to claim 8, wherein the first sub-region comprises a first outer side, the second sub-region comprises a second outer side disposed opposite to the first outer side, and the third sub-region comprises a third outer side disposed perpendicular to the first outer side and the second outer side.

10. The touch display panel according to claim 9, wherein the touch chip is disposed in a frame region of the touch display panel and close to the third outer side.

11. The touch display panel according to claim 9, wherein each of the touch signal lines connected to the touch sensing electrodes positioned in the first sub-region is led out from the first outer side and is connected to the touch chip, each of the touch signal lines connected to the touch sensing electrodes positioned in the second sub-region is led out from the second outer side and is connected to the touch chip, and each of the touch signal lines connected to the touch sensing electrodes positioned in the third sub-region is led out from the third outer side and is connected to the touch chip.

12. The touch display panel according to claim 8, wherein the touch signal lines and the touch sensing electrodes are disposed in a same layer.

13. The touch display panel according to claim 12, wherein the touch signal lines are disposed in a part of a gap formed by the adjacent touch sensing electrodes positioned in a display region.

14. The touch display panel according to claim 8, wherein the touch signal lines and the touch sensing electrodes are disposed in different layers, and each of the touch signal lines is connected to a corresponding one of the touch sensing electrodes through a via.

15. The touch display panel according to claim 8, wherein the touch sensing electrodes are made of a metal grid structure, and each of intersections of metal lines of the metal grid is a closed arc-shape.

16. The touch display panel according to claim 8, wherein a plurality of protrusions are disposed on two opposite sides of each of the touch sensing electrodes, and the protrusions disposed on each of the sides are engaged with the protrusions of adjacent one of the touch sensing electrodes.

17. The touch display panel according to claim 16, wherein shapes of the protrusions are isosceles trapezoidal, isosceles triangle, or bar-shaped.

18. The touch display panel according to claim 8, wherein shapes of the touch sensing electrodes are circular, elliptical, rectangular, diamond, or square.

* * * * *